United States Patent
Jackson et al.

(10) Patent No.: US 9,201,104 B2
(45) Date of Patent: Dec. 1, 2015

(54) INTELLIGENT POWER SENSING DEVICE

(71) Applicant: TYCO ELECTRONICS CORPORATION, Berwyn, PA (US)

(72) Inventors: Stephen Mark Jackson, Mount Joy, PA (US); Sidharth Dalmia, Fair Oaks, CA (US); Mohammad S. Ahmed, Mechanicsburg, PA (US); Raymond Howard Kohler, Souderton, PA (US); David Bruce Sarraf, Elizabethtown, PA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 422 days.

(21) Appl. No.: 13/646,787

(22) Filed: Oct. 8, 2012

(65) Prior Publication Data

US 2014/0097691 A1  Apr. 10, 2014

(51) Int. Cl.
*H02J 1/00* (2006.01)
*G01R 21/133* (2006.01)
*G01R 22/06* (2006.01)

(52) U.S. Cl.
CPC ............ *G01R 21/133* (2013.01); *G01R 22/063* (2013.01); *Y10T 307/625* (2015.04); *Y10T 307/74* (2015.04); *Y10T 307/747* (2015.04)

(58) Field of Classification Search
CPC ......... G01R 19/257; G01R 21/00; H02J 7/00; H01H 47/00; G06F 19/00; G06F 7/00; H05B 37/02
USPC ............... 307/66, 112, 113; 324/120; 702/62; 315/171, 200 R; 707/100
See application file for complete search history.

(56) References Cited

U.S. PATENT DOCUMENTS

2004/0122833 A1* 6/2004 Forth et al. .................... 707/100
2009/0043938 A1 2/2009 Wechsler
2009/0115509 A1 5/2009 Minteer
(Continued)

FOREIGN PATENT DOCUMENTS

FR 2 953 937 A1 6/2011
FR 2 969 301 A1 6/2012
GB 2 431 475 A 4/2007

OTHER PUBLICATIONS

High Speed, Half Duplex iCoupler Isolated RS-485 Transceiver, Analog Devices, ADM2486, XP-002718300, Feb. 2006, pp. 1-20, Rev. D, www.analog.com, Norwood, MA, USA.
(Continued)

*Primary Examiner* — Daniel Cavallari (57) ABSTRACT

The power sensing device includes a power input interface in electrical communication with a current sensing circuit and a voltage sensing circuit. The current sensing circuit is connected to a load. The voltage sensing circuit is connected in parallel with the load. A metering integrated circuit and a micro-controller unit (MCU) are included. The metering integrated circuit receives a first analog signal indicating a load current value from the current sensing circuit, and a second analog signal indicating a load voltage value from the voltage sensing circuit. The metering integrated circuit converts first and second analog input signals to first and second digital signals, respectively, and generates the first and second digital signals as digital communication pulses to the MCU. A decoder circuit includes a communications port to send and receive data associated with a sensed current parameter and a sensed voltage parameter.

9 Claims, 5 Drawing Sheets

(56) References Cited

U.S. PATENT DOCUMENTS

| | | |
|---|---|---|
| 2009/0212759 A1 | 8/2009 | Melanson |
| 2011/0184675 A1 | 7/2011 | White et al. |
| 2011/0242713 A1 | 10/2011 | Dalmia et al. |
| 2011/0272094 A1 | 11/2011 | Dalmia et al. |
| 2011/0291789 A1 | 12/2011 | Dalmia et al. |
| 2013/0054165 A1* | 2/2013 | Ramirez ............... 702/62 |
| 2013/0154487 A1* | 6/2013 | Kuang et al. .......... 315/171 |

OTHER PUBLICATIONS

International Search Report, International Application No. PCT/US2013/063423, International Filing Date, Oct. 4, 2013.

* cited by examiner

INTELLIGENT POWER SENSING DEVICE

BACKGROUND

The application generally relates to a power sensing device. The application relates more specifically to a device for sensing power and providing isolated data related to the sensed power.

Electrical power distribution networks or power grids have become very large, mature and highly interconnected power systems. A smart grid refers to the application of digital processing and communications to the power grid to permit data flow and information management associated with the electrical distribution network. A smart grid as a next-generation electric power network system improves the efficiency of a system by applying telecommunication technology to existing processes of electrical production, transport, and consumption of electric power. An electric power supplier may interface with consumers to improve the efficiency of the system. As a result electricity may be produced as needed or can be used depending on the production. A smart grid that is capable of detecting consumption and supply of electricity, and condition of a power line by merging data technology with a smart grid is desirable from a public policy standpoint as well.

Many products are being developed for compatibility with the smart grid and smart power applications. In order to obtain electrical power-related data, it is currently necessary to design a custom metering solution requiring extensive development time, the use of printed circuit board (PCB) space, and extensive calibration during assembly.

Intended advantages of the disclosed systems and/or methods satisfy one or more of these needs or provide other advantageous features. Other features and advantages will be made apparent from the present specification. The teachings disclosed extend to those embodiments that fall within the scope of the claims, regardless of whether they accomplish one or more of the aforementioned needs.

SUMMARY

One embodiment relates to a power sensing device. The power sensing device includes a power input interface in electrical communication with a current sensing circuit and a voltage sensing circuit. The current sensing circuit is connected in series with a load. The voltage sensing circuit is connected in parallel with the load. A metering integrated circuit (IC) and a micro-controller unit (MCU) are included. The metering integrated circuit receives a first analog signal indicating a load current value from the current sensing circuit, and a second analog signal indicating a load voltage value from the voltage sensing circuit. The metering integrated circuit converts first and second analog input signals to first and second digital signals, respectively, and communicates with the MCU across an isolation barrier which includes a communications port to send and receive data associated with a sensed current parameter and a sensed voltage parameter.

Another embodiment relates to a wall socket adapter. The wall socket adapter includes a first circuit path for charging a battery, and a second circuit path. The second circuit path is connected in parallel with the first circuit path. The second circuit path includes a power sensing device, a microcontroller and a wireless transceiver. The power sensing device is in electrical communication with the battery and in data communication with a microcontroller. The microcontroller communicates isolated data to a remote device. Power terminals are provided for connecting the adapter to a line voltage power input for powering the adapter and a load, and output terminals are provided for outputting line voltage to the load.

Applications include environmentally efficient power management and predictive health and diagnostics. One aspect is the ability to sense power usage continuously with great accuracy. Custom power sensing may include a current sensor, a metering IC, circuitry to isolate the metering IC from a device MCU, and calibration of the circuit's parameters during product assembly.

Certain advantages of the embodiments described herein are a standardized electrical power sensor that provides a high level of accuracy at a low cost. Another advantage is a miniature component that easily connects to a variety of products. Still another advantage is the ability to provide isolated data in a format that is easy to implement without the need for performing lengthy calibrations.

Alternative exemplary embodiments relate to other features and combinations of features as may be generally recited in the claims.

DETAILED DESCRIPTION OF THE EXEMPLARY EMBODIMENTS

Figure 1:
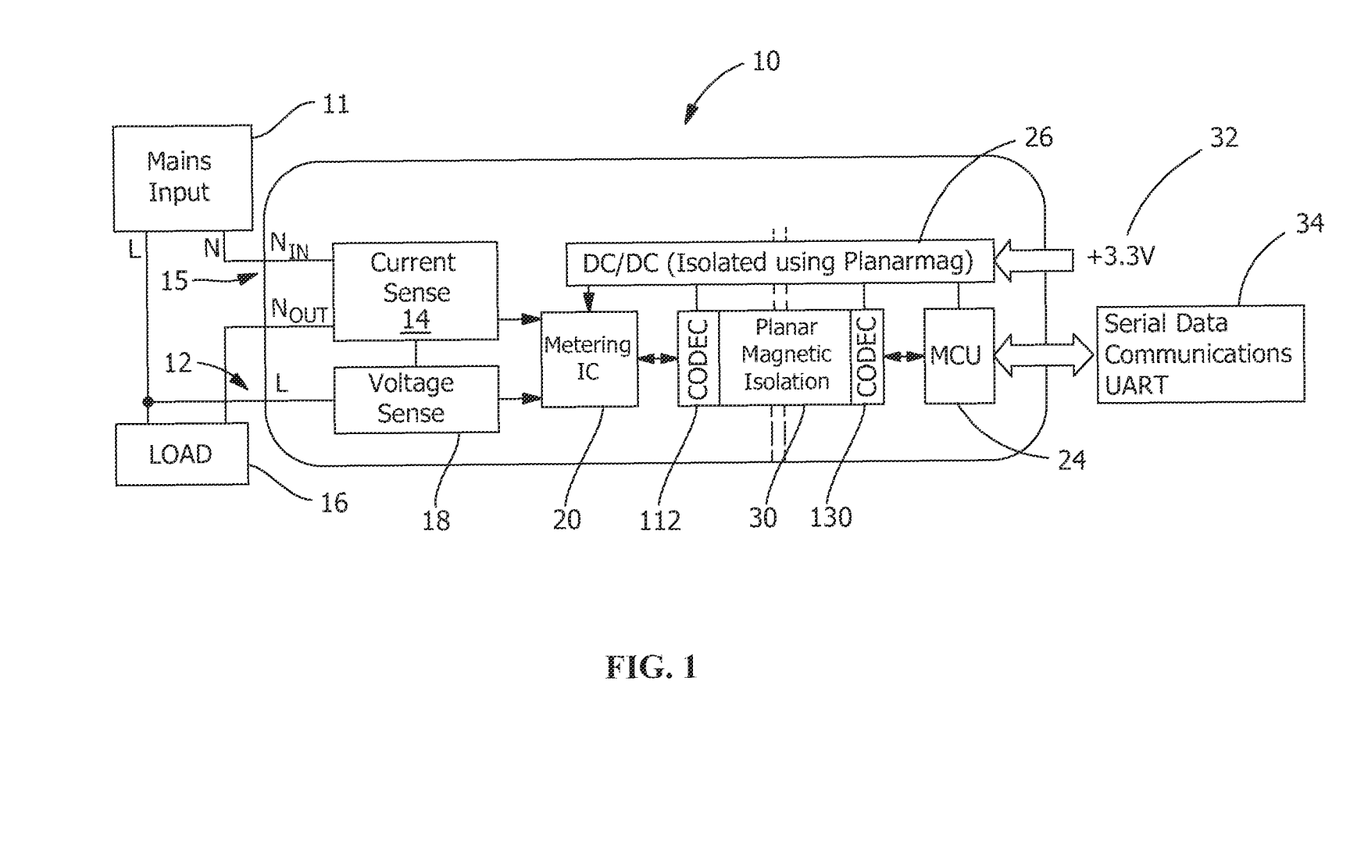
FIG. 1 is an exemplary embodiment of a power sensing device.

Referring to FIG. 1, one embodiment of a power sensing device 10 is disclosed. Power sensing device 10 includes a power input interface 12 for receiving a line voltage L and a neutral voltage N of an AC power source 11. A current sensing circuit 14 is connected in series with a load 16 and a voltage sensing circuit 18 is connected in parallel with load 16. Current sensing circuit 14 includes one or more line ports 15 for output connection to load 16. Current sensing circuit 14 may be an integrated circuit having a current transformer, shunt resistor, a coil, and an analog transducer and planar magnetic elements. The coil of current sensing circuit 14 may be, e.g., a Rogowski coil or similar electrical device for measuring alternating current (AC) or high speed current pulses. The analog transducer current sensing circuit 14 may be, e.g., a Hall Effect transducer that varies an output voltage signal in response to a magnetic field. Voltage sensing circuit 18 may be an integrated circuit having a resistor divider circuit, a transistor and an op amp.

Figure 2:
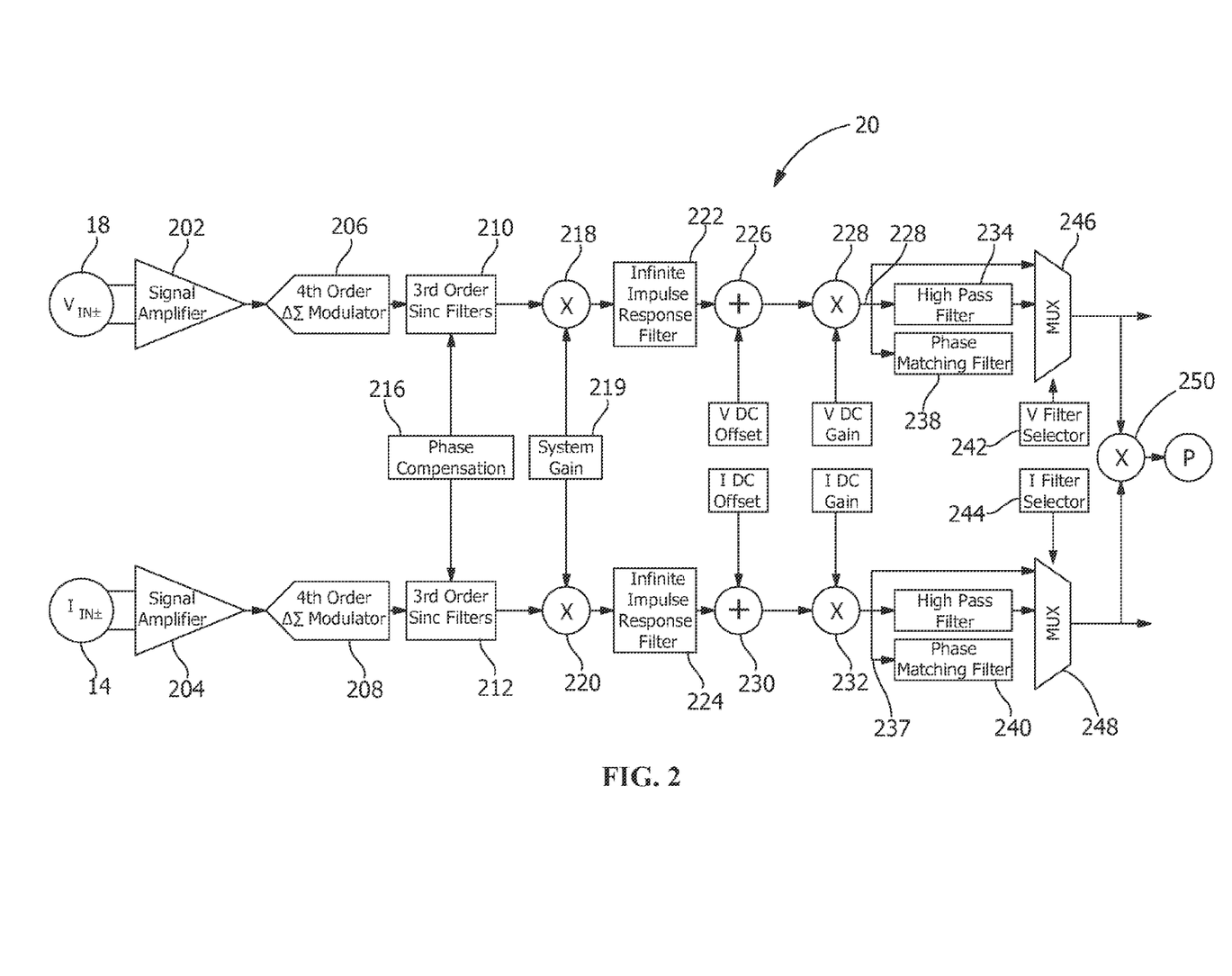
FIG. 2 is an embodiment of an exemplary metering integrated circuit (IC).

Current sensing circuit 14 outputs a signal to a metering integrated circuit (IC) 20. Metering IC 20 may include a 4th order Delta-Sigma analog-to-digital converter for every channel measured. At least two channels are required for power calculation. Current is measured on one channel and voltage is measured on another channel. In one embodiment metering IC 20 may be a Utility grade metering IC, Metering IC 20 is schematically illustrated in FIG. 2. The output signals from current sensing circuit 14 and voltage sensing circuit 18 are input to metering IC 20. The voltage input signal and current input signal to metering IC 20 are first applied to signal amplifier 202 and signal amplifier 204, respectively. Each signal is amplified to a suitable level for processing. Meter IC 20 may have, e.g., a selectable gain of either 10× or 50× based on the input sensor circuit and a fixed gain of 10× based on the voltage sensor circuit. A fourth-order delta-sigma modulator 206, 208 converts each of the voltage and current signals, respectively, from analog to single-bit digital data streams. In one embodiment modulator 206, 208 samples the respective signal at a rate of proportional to the system clock frequency provide a wide dynamic range and simplified anti-alias filter design. Each of the modulated signals are then input to a 3rd order sinc filter 210, 212. Sinc filters 210, 212 modify the respective voltage and current signals to increase the modulator output granularity for greater accuracy. During calibration, phase compensation element 216 may insert a delay into sinc filters 210, 212 to align the current and voltage phases as necessary. Next, at multipliers 218, 220, a system gain calibration value 219 adjusts all channels to compensate for voltage reference error. The calibrated signal are then forwarded to infinite impulse response (IIR) filters, 222, 224. IIR Filters 222, 224 compensate for the amplitude roll-off to provide droop-corrections. At the output to IIR filter 222, a DC voltage offset calibration value is inserted at offset element 226, and a DC voltage gain compensation value is inserted to the offset voltage at gain element 228 to correct errors due to system component tolerances. Similarly, at the output to IIR filter 224, a DC voltage offset calibration value is inserted at offset element 230, and a DC voltage gain compensation value is inserted to the offset voltage at gain element 232, also to correct errors due to system component tolerances. For AC power measurements, high pass filters 234, 236 are enabled in the voltage channel 235 and current channel 237 and phase matching filters 238, 240 match the phase response of the high pass filter, e.g., if high pass filtering is used on only one channel. A filter enable signal from voltage filter selector 242 or current filter selector 244 applies a calibration parameter to an associated multiplexer 246, 248 to select the desired filter to apply to the voltage and current; high pass filter 234, 236, phase-matching filter 238, 240, or no filter. The output of multiplexers 246, 248 provides voltage and current values that are then applied to multiplier 250 to generate the output value representing power P consumed by load 16.

The metering IC measures voltage, current, and temperature then reports root mean square voltage (VRMS) and current (IRMS), apparent power (S), power factor (PF), line frequency (F), and temperature (T).

Root Mean Square (RMS) voltage and current are calculated from the measured instantaneous voltage and current, as indicated in Equation 1:

$$V_{RMS} = \sqrt{\frac{\sum_{n=0}^{N-1} V_n^2}{N}},$$

$$I_{RMS} = \sqrt{\frac{\sum_{n=0}^{N-1} I_n^2}{N}}$$

Equation 1 wherein $V_n$ and $I_n$ are the instantaneous voltage and current respectively. N is the number of instantaneous samples measured for RMS calculations and is a stored calibration value.

Active Power (P) is calculated as indicated in Equation 2:

$$P = \sqrt{\frac{\sum_{n=0}^{N-1} V_n \times I_n}{N}}$$

Equation 2

Power Factor_(PF) is calculated as indicated in Equation 3:

$$PF = \frac{P}{V_{RMS} \times I_{RMS}}$$

Equation 3

Line frequency is measured on the voltage channel and is updated at certain time intervals with high resolution.

Metering IC 20 may include a temperature sensor (not shown) to compensate for temperature drift of the voltage reference.

In addition to these measurements and calculations, metering IC 20 may optionally may also be configured to provide apparent power, reactive power, peak current, peak voltage, energy, voltage sag, voltage swell, over-current, and zero-cross detection.

Figure 3:
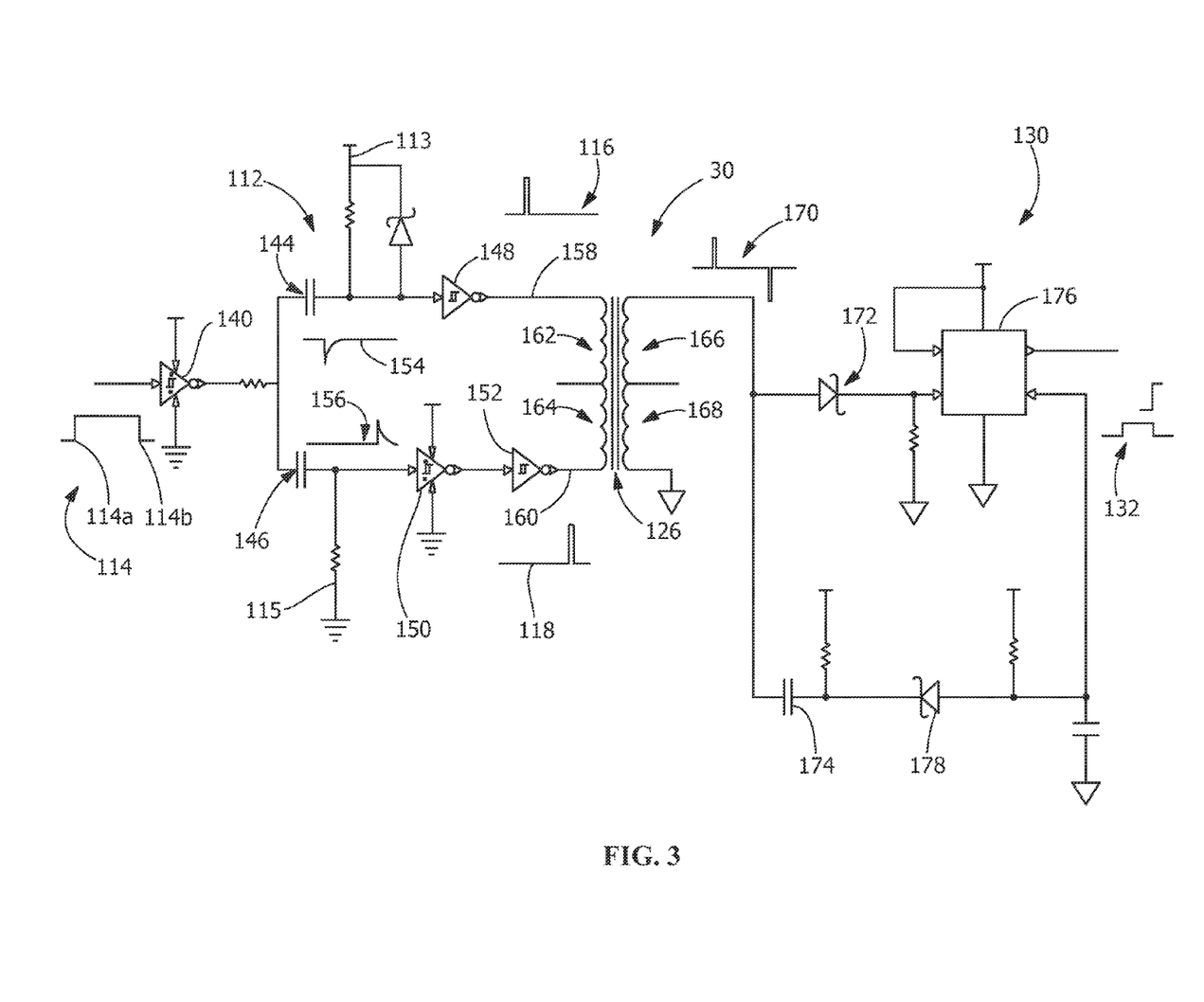
FIG. 3 shows an exemplary digital isolation circuit.
Figure 4:
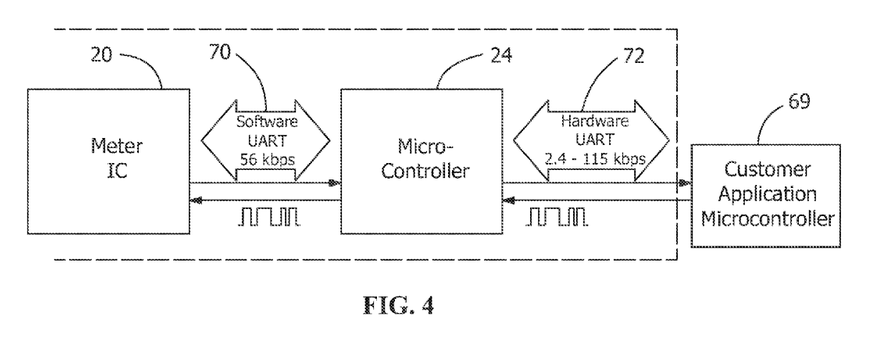
FIG. 4 shows an exemplary communications management schematic using Universal Asynchronous Receive and Transmit (UART) interfaces.
Figure 5:
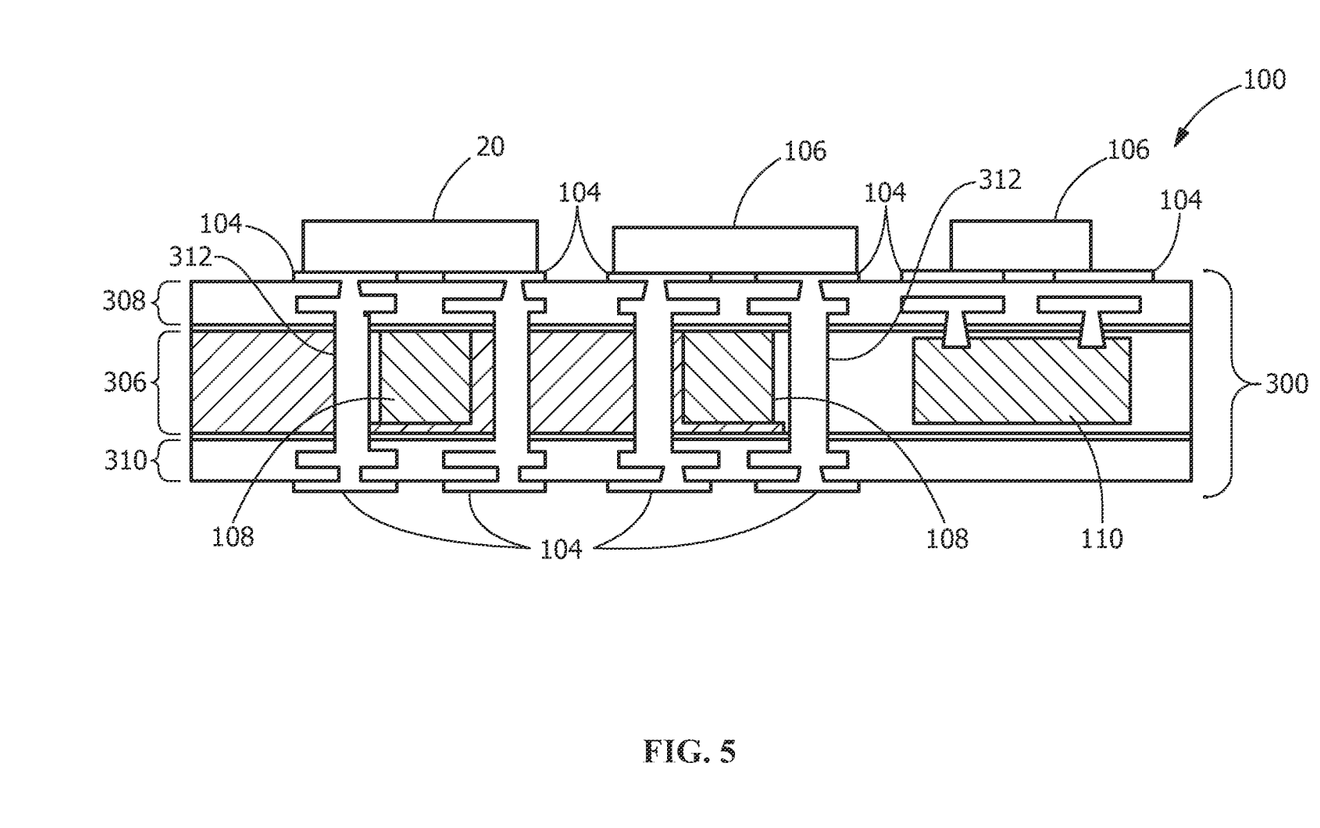
FIG. 5 shows cross-sectional view of an exemplary planar magnetic substrate for a power sensing device.

Referring next to FIGS. 3-5, An encode circuit 112 receives an input signal 114 and divides input signal 114 into two signal pulses 116, 118 at the output of encode circuit 112. The low-to-high leading edge 114a of input signal 114 generates the first or top pulse 116 and the high-to-low trailing edge 114b generates the second or bottom pulse 118. Using this method isolation is independent of input signal speeds.

The output signals 116, 118 of encode circuit 112 are input to the primary winding 162 and 164 of the planar magnetic circuit 30. The secondary winding 166 and 168 of planar magnetic circuit 30 is coupled to primary winding through core 126 to generate isolated signal 170. Isolated signal 170 of planar magnetic circuit 30 converts the two positive pulses 116, 118 into a positive and a negative pulse. Isolated signal is electrically isolated from primary winding and input signal 114.

A decode circuit 130 receives isolated signal 170 from secondary winding 166 and 168 of planar magnetic circuit 30 and reconstructs isolated signal 170 to generate output signal 132. Output signal 132 will be substantially identical to input signal from current sensing circuit 14 with only a very small propagation delay.

Referring next to FIG. 3, an exemplary encode circuit 112 is shown. An input signal 114 is applied to a signal inverter 140 of encode circuit 112. Inverted signal Tx is represented by a digital waveform. Signal inverter 140 output is connected to a pair of parallel capacitors 144, 146. Capacitor 144 and capacitor 146 may have approximately identical capacitance values, e.g., 100 picofarad (pf). Capacitor 144 is responsive to the leading edge 114a of Tx IN 114, and generates a negative decaying impulse waveform 154. Capacitor 146 is response to trailing edge 114b of Tx IN 114, and generates a positive decaying impulse waveform 156. Capacitor 144 is connected on a load side to a signal inverter 148. Signal 154 is input to signal inverter 148, which inverts signal 154 and generates a positive square wave pulse 116 as an output signal. Capacitor 146 is connected on a load side to a pair of inverters 150, 152. Inverters 150, 152 are connected in series between capacitor 146 and planar magnetic transformer 30. Signal 156 is input to first signal inverter 150, which inverts signal 156 and transmits to signal inverter 152. Signal inverter 152 generates a positive output square wave pulse as an output signal 118.

The encode circuit outputs the combination of signals 116 and 118 as two square wave pulses separated by an interval approximately equal to the positive peak of signal 114. In one embodiment signal inverters may be Schmitt inverters/buffer.

An exemplary planar magnetic transformer 30 is shown. Encode circuit 112 is connected at its output to planar magnetic transformer 30. The pair of pulses 116, 118 present at the output of encode circuit 112 are applied to terminals 158 and 160, respectively, at the input to planar magnetic transformer 30. Transformer polarity is indicated by (•) symbols on windings 62, 64, 66, and 68. Planar magnetic transformer 30 transforms pulse 116 as a positive pulse and pulse 118 as a negative pulse, resulting in a combined signal 170 at the output of planar magnetic transformer 30.

Signal 170 is applied to the input of decode circuit 130. Decode circuit 130 includes a forward biased diode 172 and a capacitor 174 connected in parallel. Diode 172 is connected to a flip flop 176 at a first input terminal of flip flop 176. In one embodiment flip flop 176 may be a single positive edge-triggered D-type CMOS flip flop. Capacitor 174 is connected with a reverse-biased diode 178 in series with a second input of flip flop 176. The output of flip flop 176 is represented by square-wave signal 132, substantially identical to input signal 114, with very little propagation delay. The output square-wave signal 132 is galvanically isolated from input signal 114.

In one embodiment planar magnetic isolation circuit 30 operates at frequencies up to 20 MHz, or pulses with 50 ns maximum pulse widths. In one embodiment the circuit encoding scheme uses a positive 50 ns pulse for a rising edge of a UART signal, e.g., 0 V to 3.3 V transition, and a negative 50 ns pulse for a falling edge, e.g., 3.3 V to 0 V transition. The UART Tx input is inverted and split with line 113 pulled up to 3.3V and the other line 115 pulled to 0V. The 3.3V line is inverted with a time constant producing a 50 ns pulse based on the rising edge of the UART Tx. The 0V line is inverted twice with a time constant producing a 50 ns pulse based on the falling edge of the UART Tx. Signals 116 and 118 are the differential inputs to the planar magnetic transformer 30 on the primary side. This results in the transformer output 170 on the secondary side that has a positive pulse e.g., +3.3V, for the rising edge of UART Tx and a negative pulse, e.g., −3.3V, for the falling edge of UART Tx. The D-Type Flip Flop allows the Tx OUT signal to be an isolated replica of the input UART Tx, with negligible delay. A similar arrangement for the Rx line allows bi-directional communication across an isolated gap 126. Bi-directional communication requires two planar magnetic transformers 30 and provides galvanic isolation meeting common industrial safety standards.

The planar magnetic isolation circuit 30 provides galvanic isolation between metering IC 20 and microcontroller unit 24. Providing galvanic isolation, with an encode circuit and a decode circuit, at a serial data communications interface allows a significant increase to the signal frequency, thereby reducing the size of the magnetic component required to provide isolation. Encoding circuitry 112 is connected at an input of planar magnetic transformer 30 and receives the output of a serial interface of metering IC 20. In one embodiment the serial interface may be a UART having configurable transmission speeds ranging from 600 bps to over 115,200 bps. A UART at 115,200 bps operates at a frequency of 115 kHz which still requires a sizable magnetic component for isolation. A decode circuit 130 is connected at the secondary or output of planar magnetic transformer 30.

The microcontroller unit 24 stores calibration values for meter IC 20. Calibration values may be stored, e.g., in microcontroller unit 24 non-volatile memory, or NVM, (not shown). Microcontroller unit 24 further provides communications management and simplification between meter IC 20 and external devices, and determines the temperature via an on-chip temperature sensor (not shown) and provides the temperature readings to external devices. In addition, the microcontroller stores a unique address and serial number so that multiple power sensing devices 10 may be connected to a common serial interface.

In one embodiment, a calibration procedure is as follows: Meter IC 20 is configured for initial conditions; analog voltage and current input are applied to metering IC 20 from an accurate source; the desired calibration, e.g., voltage or current, is enabled; the calibration step is then executed. Results of the calibration are then read and compensation values are calculated. The results are then stored in NVM on microcontroller unit 24.

Referring to FIG. 4, Microcontroller unit 24 is also configured to perform communications management. Microcontroller unit 24 requires two independent UART serial interfaces. The first UART 70 is a UART software communications interface that communicates with meter IC 20. The purpose of the first UART serial interface 70 is to provide the meter IC 20 with calibration values. The purpose of the second UART serial interface 72 is to continuously read the voltage, current, active power, power factor and frequency from metering IC 20 and store voltage, current, active power, power factor and frequency values in registers that are in data communication with an external application microcontroller (CAM), e.g., at a power customer location. The second UART serial interface 72 is a UART hardware communications interface that communicates with the CAM to provide any or all of the six key power parameters to the customer. The command structure is discussed in further detail below.

Data communication occurs internally between meter IC 20 and the microcontroller and externally between microcontroller unit 24 and the Customer Application Microcontroller (CAM) 69. In one embodiment, the UART software interface 70 between meter IC 20 and microcontroller unit 24 is a UART that is set, e.g., at a baud rate of 56000 bps. The purpose of UART software communication interface 70 is for microcontroller unit 24 to continuously update its registers with the power parameters every time they are updated and available from meter IC 20. In one embodiment the power parameters are root mean square voltage (VRMS), root mean square current (IRMS), active power (P), power factor (PF), line frequency (F), and temperature (T). It should be understood that the power parameters are exemplary, and more or less power related parameters may be included, within the scope of the appended claims.

UART software communication interface 70 minimizes the amount of skew time between the actual measurement and when the values are available to the customer. The software UART interface/communication loop is independent from the external communications and is isolated by placing it on a separate UART channel. Since meter IC 20 also calculates other power parameters outside of the power parameters enumerated above, expanding the power sensing device 10 to report other values requires only a firmware change and allows a hardware platform design with unique firmware.

For external communications between microcontroller unit 24 and CAM 69, the interface between power sensing device 10 and a CAM 69 may be a hardware-UART interface 72. Hardware UART interface 72 may be programmable to a rate of 2400 to 115200 bps. The power sensing device 10 may be configured for three different modes, e.g., one-shot mode, polling mode, and alarm mode. In one-shot mode, CAM 69 may request any one of six power parameters or all parameters and power sensing device 10 will communicate the requested parameters via the UART hardware interface 72. Data is transmitted only once. In polling mode, CAM 69 may request any one power parameter, or all six power parameters, along with the recurrence period, and power sensing device 10 communicates the requested data via the hardware UART interface 72 every period. The period may be selectable between 100 milliseconds and 10 seconds. In polling mode, communication continues between power sensing device 10 and CAM 69 until a different mode is selected by the user. In alarm mode CAM 69 may set alarms, e.g., for minimum and maximum voltage, current, and temperature values. In alarm mode, power sensing device 10 communicates the alarmed parameter when the measured value exceeds the maximum value, or is less than the minimum value. The alarm parameter is communicated once every 100 ms continuously until the alarm condition is corrected.

Planar magnetic isolation circuit 30 is connected between MCU 24 and metering IC 20, e.g., to protect against device damage due to current surges or mis-matched ground potential between communication points. Decoder circuit 130 includes a power input port 32 for receiving power for decoder circuit 130, and a communications port 34. Communications port 34 may be arranged to receive and send signals in any of SPI, UART, I2C, RS-485, CAN or similar communications data formats. MCU 24 outputs may include, e.g. analog signals indicating current, voltage power and temperature; digital signals transmitted over a hard wired port—e.g., I2C or PLC data buses; digital signals over wireless communications—e.g., Zigbee or WiFi standards. The data output may provide useful information to the user, e.g., for energy monitoring and consumption, internally induced brown-outs or overloads caused by excessive voltage, current or temperature conditions; product health, periodic automatic self-testing of equipment; and automatic temperature de-rating of devices.

Referring next to FIG. 5 one embodiment of power sensing device 10 is shown as a cross-sectional view of planar magnetic substrate 100. FIG. 5 shows a ferrite magnetic core or element 108 embedded in a PCB substrate 100 with copper etched on the top and bottom. Plated vias 312 allow the PCB substrate 100 to effectively wrap a copper trace around the ferrite magnetic core 108 in the same way a copper wire is hand wound around a magnet. Substrate 100 is a planar body having a thickness dimension 300 that vertically extends from a lower surface 310 to an upper surface 308. In one embodiment, the thickness dimension 300 is 3.0 millimeters or less. Alternatively, the thickness dimension 300 may be 2.5 millimeters or less. In another embodiment, the thickness dimension 300 is 1.0 millimeter or less. Substrate 100 may include a center layer 306 having an upper outer layer 308 and a lower outer layer 310 disposed on opposite sides of center layer 306. Center layer 306 can be a flexible and non-rigid body, such as a layer of cured epoxy, while outer layers 308, 310 can be non-flexible and rigid bodies, e.g., cured FR-4 material. In the illustrated embodiment, conductive traces or pads 104 are disposed on and/or within outer layers 308, 310 but not within center layer 306. Alternatively, conductive traces 104 can extend through center layer 306. In another embodiment, the substrate 100 can be a single, unitary body formed from a single material or type of material.

Input terminals L, N (see FIG. 1) are formed as conductive pads 104 disposed on the upper surface 304 of the substrate 100. As conductive traces 104 electrically couple metering IC 20, small components 106, ferrite elements 108 and embedded elements 110 in parallel with each other in each of the voltage protection circuit in planar magnetic transformer 30 (shown in FIG. 3). Alternatively, metering IC 20, small components 106, the ferrite elements 108 and embedded elements 110 may be coupled in series, or in series/parallel combinations.

Metering IC 20 and small components 106 are mounted to the upper surface 304 of the substrate 100 in the illustrated embodiment. For example, Metering IC 20 and small components 106 may be conductively coupled with the conductive traces 104 using one or more interconnections, such as a wire bond and/or solder ball connection. Alternatively, metering IC 20 and small components 106 may be entirely disposed within the substrate 100. For example, metering IC 20 and small components 106 can be located within the thickness dimension 300 of the substrate 100 such that no part of metering IC 20 and small components 106 protrudes above, breaks, or passes through a plane defined by the upper surface 308 of the substrate 100 or a plane defined by the lower surface 310 of the substrate 100.

Ferrite elements 108 may be disposed entirely within substrate 100 in the illustrated embodiment. For example, ferrite elements 108 may be located within the thickness dimension 300 of substrate 100 such that ferrite elements 108 are entirely located within the center layer 306 of the substrate 100 and no part of ferrite elements 108 extends into either of the outer layers 308, 310 of the substrate 100. For example, no part of ferrite elements 108 may protrude above, break, or pass through a plane defined by an interface between the center layer 306 and the upper outer layer 308 and/or an interface between the center layer 306 and the lower outer layer 310. Alternatively, ferrite elements 108 may be mounted onto the substrate 100, such as by being conductively coupled with the upper surface 304 of the substrate 100.

Embedded components 110 disposed within the substrate 100 may be conductively coupled with conductive traces 104 disposed within the outer layers 308, 310 of the substrate 100 and/or the conductive traces 104 disposed on the upper surface 308 of the substrate 100 by conductive vias 312 in the illustrated embodiment. The vias 312 may be holes or channels that are plated with a conductive material or substantially filled with a conductive material, such as copper. The vias 312 may vertically extend through all or a portion of the thickness dimension 300 of the substrate 100. In one embodiment, the vias 312 may be conductively coupled with conductive plates or electrodes in ferrite elements 108. For example, each via 312 may be conductively coupled with a different electrode of a ferrite element 108.

Figure 6:
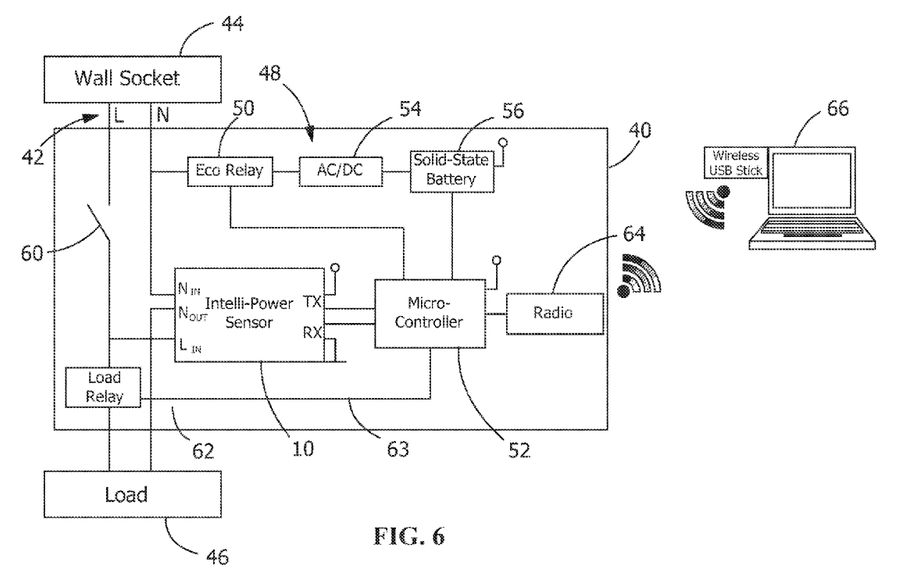
FIG. 6 is a wall socket adaptor including a power sensing device.

Referring next to FIG. 3, in one embodiment a wall socket adapter 40 may include a power sensing device 10. Power sensing device 10 may be, e.g., an AFE IC device. Wall socket adapter 40 includes input terminals 42 for external connection to line voltage L and neutral N of a wall socket 44. Wall socket 44 may be any conventional wall outlet, e.g., a 120-volt AC outlet, two prong, grounded outlet, for residential or commercial use or, alternatively, wall socket 44 may be a customized power receptacle. Wall socket terminals 42 are coupled to a load 46 through adapter 40. Line voltage L from wall socket 44 is electrically coupled directly to a first circuit path 48. A control relay 50 is controlled by a microcontroller 52. Microcontroller 52 is configured to actuate relay 50 to charge a solid state battery 56 by powering a converter 54 connected between relay 50 and battery 56. When battery 56 is fully charged microcontroller 52 deactivates relay 50 so that no power is drawn from line L until battery 56 begins to discharge again. Converter 54 converts input AC power from line L to DC power for charging battery 56. Battery 56 may be a 3.3 VDC battery, although other voltages may be used which are suitable for operating the power sensing device 10 and associated circuit elements. Battery 56 and microcontroller 52 monitor and maintain the voltage within an acceptable tolerance for microcontroller 52. Microcontroller 52 includes a reference voltage input, e.g., 3.2 v, for monitoring voltage levels from battery 56.

Line voltage L from wall socket 44 is electrically coupled directly to a second circuit path 58 through a manual switch 60 connected in parallel with first circuit path 48. Switch 60 connects line L to an input terminal $L1_{in}$ of power sensing device 10. Line voltage is provided at an output terminal $L1_{out}$ of power sensing device 10 and connected to a load relay 65. Load relay 65 controls power to load 46 based on control signals from microcontroller 52. E.g., load relay 65 may be actuated by microcontroller 52 through signal path 63 to interrupt power flowing to load 46 under certain conditions, e.g., overvoltage, voltage, sag, over-current, and over-temperature.

Second circuit path 58 includes power sensing device 10, microcontroller 52 and a radio transceiver 64. Power sensing device 10 is in electrical communication with a control power source, e.g., −3.3.volt or other voltage if applicable. Microcontroller 52 is in data communication via a data path between microcontroller 52 and data terminals TX and RX of power sensing device 10. Microcontroller 52 is in data communication with a remote computer 66 via a radio transceiver 64. Microcontroller 52 provides isolated data to remote computer 66.

The novel combination of sensors, packaging, and smart connectivity as described above enables integration of the elements required to sense power into one component. The disclosed integrated power sensor provides a simplified design, reduced size, and lower assembly and test times.

It should be understood that the application is not limited to the details or methodology set forth in the following description or illustrated in the figures. It should also be understood that the phraseology and terminology employed herein is for the purpose of description only and should not be regarded as limiting.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the intelligent power sensing device as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

What is claimed is:

1. A power sensing device comprising:
    a power input interface in electrical communication with a current sensing circuit and a voltage sensing circuit;
    the current sensing circuit connected in series with a load and the voltage sensing circuit connected in parallel with the load;
    a metering integrated circuit; and
    a micro-controller unit (MCU)
    the metering integrated circuit configured to:
        receive a first analog signal indicating a load current value from the current sensing circuit, and a second analog signal indicating a load voltage value from the voltage sensing circuit;
        convert first and second analog input signals to first and second digital signals, respectively; and
        generate the first and second digital signals into a digital communication signal to the MCU;
    a decoder circuit comprising a communications port to send and receive data associated with a sensed current parameter and a sensed voltage parameter; and
    a converter that receives DC power and powers the MCU, the encoder circuit and the decoder circuit on a first side of a galvanic isolation; and isolated DC power is provided to a metering IC side of the galvanic isolation via a planar magnetic circuit and an oscillator output from the MCU.

2. The system of claim 1, wherein the current sensing circuit comprises an integrated circuit having a current transformer, a shunt resistor, a coil, an analog transducer or planar magnetic elements.

3. The system of claim 2, wherein the coil is a Rogowski coil for measuring alternating current (AC) or high speed current pulses.

4. The system of claim 2, wherein the analog transducer current sensing circuit is a Hall effect transducer configured to vary an output voltage signal in response to a magnetic field.

5. The system of claim 1, wherein the voltage sensing circuit comprises an integrated circuit having a resistor divider circuit.

6. The system of claim 1, wherein the MCU comprises a processor, memory, and programmable input/output peripherals configured to process input data from a metering IC.

7. The system of claim 1, wherein the MCU stores voltage and current input data, and performs power usage calculations, diagnostics, control decisions, communications, display drive and real-time clock, based on the stored voltage and current input data.

8. The system of claim 1, wherein the MCU transmits output data to the encoder circuit via the planar magnetic isolation circuit; the planar magnetic isolation circuit configured to provide galvanic isolation between the MCU and the encoder circuit.

9. The apparatus of claim 1, wherein the current sensing circuit further comprises at least one line port for output connection to the load.

\* \* \* \* \*